(12) United States Patent
Wang et al.

(10) Patent No.: US 12,320,991 B2
(45) Date of Patent: Jun. 3, 2025

(54) COMPOSITE LENS AND MANUFACTURING METHOD THEREFOR, AND INFRARED DETECTOR

(71) Applicant: YANTAI RAYTRON TECHNOLOGY CO., LTD, Shandong (CN)

(72) Inventors: Peng Wang, Shandong (CN); Chuanqing Yu, Shandong (CN)

(73) Assignee: YANTAI RAYTRON TECHNOLOGY CO., LTD, Shandong (CN)

( * ) Notice: Subject to any disclaimer, the term of this patent is extended or adjusted under 35 U.S.C. 154(b) by 267 days.

(21) Appl. No.: 18/029,371

(22) PCT Filed: Nov. 30, 2020

(86) PCT No.: PCT/CN2020/132653
§ 371 (c)(1),
(2) Date: Mar. 29, 2023

(87) PCT Pub. No.: WO2022/068031
PCT Pub. Date: Apr. 7, 2022

(65) Prior Publication Data
US 2023/0358921 A1   Nov. 9, 2023

(30) Foreign Application Priority Data

Sep. 29, 2020   (CN) .......................... 202011053733.3

(51) Int. Cl.
*G02B 3/00*   (2006.01)
*G01J 5/0806*   (2022.01)
(Continued)

(52) U.S. Cl.
CPC .............. *G02B 3/00* (2013.01); *G01J 5/0806* (2013.01); *G01J 5/10* (2013.01); *G02B 1/002* (2013.01);
(Continued)

(58) Field of Classification Search
CPC ........ G02B 3/00; G02B 1/002; G02B 3/0018; G02B 3/08; G02B 27/0025;
(Continued)

(56) References Cited

U.S. PATENT DOCUMENTS 7,492,530 B2    2/2009  Kim
10,473,948 B2   11/2019 Elsinger
(Continued)

FOREIGN PATENT DOCUMENTS

CN     1567017 A    1/2005
CN     2757154 Y    2/2006
(Continued)

OTHER PUBLICATIONS

International Search Report for PCT/CN2020/132653 mailed Jul. 5, 2021, ISA/CN.
(Continued)

*Primary Examiner* — David P Porta
*Assistant Examiner* — Meenakshi S Sahu
(74) *Attorney, Agent, or Firm* — Yue (Robert) Xu; Apex Attorneys at Law, LLP

(57) ABSTRACT

A composite lens and a manufacturing method, and an infrared detector. The composite lens comprises a substrate (2); a lens (3) located on the first surface of the substrate (2); and a first metasurface structure array (1) that is provided on the second surface of the substrate (2) according to the surface type machining error of the lens (3), the first metasurface structure array (1) comprising a plurality of metasurface structure units. The first surface is opposite to the second surface. Because the lens (3) and the first metasurface structure array (1) are located on two different surfaces of the substrate (2), after the lens (3) is manufactured, the first metasurface structure array (1) can be set according to the surface type of the lens (3), so as to correct
(Continued)

an aberration that is generated due to a surface type error when the lens (3) is machined; moreover, because the first metasurface structure array (1) can be set after the lens (3) is manufactured, the tolerance to a machining error is extremely high.

19 Claims, 13 Drawing Sheets

(51) Int. Cl.
 *G01J 5/10* (2006.01)
 *G02B 1/00* (2006.01)
 *G03F 7/00* (2006.01)
(52) U.S. Cl.
 CPC . *G01J 2005/106* (2013.01); *G02B 2003/0093* (2013.01); *G03F 7/0005* (2013.01)
(58) Field of Classification Search
 CPC ...... G02B 27/0012; G01J 5/0806; G01J 5/10; G01J 2005/106; G03F 7/0005
 See application file for complete search history.

(56) References Cited

U.S. PATENT DOCUMENTS

| | | |
|---|---|---|
| 2018/0267362 A1 | 9/2018 | Gahagan et al. |
| 2019/0154877 A1 | 5/2019 | Capasso et al. |
| 2020/0064523 A1 | 2/2020 | Majhi et al. |
| 2020/0174163 A1 | 6/2020 | Han et al. |
| 2020/0264343 A1 | 8/2020 | Han et al. |
| 2021/0103075 A1 | 4/2021 | Park et al. |

FOREIGN PATENT DOCUMENTS

| | | | |
|---|---|---|---|
| CN | 107003557 A | 8/2017 | |
| CN | 107797268 A | 3/2018 | |
| CN | 108761585 A | 11/2018 | |
| CN | 208283579 U | 12/2018 | |
| CN | 109196387 A | 1/2019 | |
| CN | 110007451 A | 7/2019 | |
| CN | 110244452 A | 9/2019 | |
| CN | 110488394 A | 11/2019 | |
| CN | 110568530 A | 12/2019 | |
| CN | 111257975 A | 6/2020 | |
| CN | 111572235 A | 8/2020 | |
| CN | 112630868 A | 4/2021 | |
| GB | 2390327 A | 1/2004 | |
| IN | 108873121 A | 11/2018 | |
| KR | 20200099832 A | 8/2020 | |
| WO | 2019072767 A1 | 4/2019 | |
| WO | 2019164849 A1 | 8/2019 | |
| WO | WO2021/118794 * | 6/2021 | ............... G02B 3/08 |

OTHER PUBLICATIONS

Chen Wei Ting et a l: "A broadband achromatic metalens for focusing and imaging in the visible" Nature Nanotechnology , Nature Pub. Group,Inc,London , vol. 13 , No. 3,Mar. 1, 2018 (Mar. 1, 2018) , pp. 220-226 , XP036449121,ISSN: 1748-3387 , DOI: 10.1038/S41565-017-0034-6 [retrieved on Jan. 1, 2018].

Chen Wei Ting et al: "Supplementary information for: A broadband achromatic metalens for focusing and imaging in the visible" Nature Nanotechnology,vol. 13 , No. 3 , Mar. 1, 2018 (Mar. 1, 2018) , pp. 1-15 , XP093203562, London, ISSN: 1748-3387 , DOI: 10.1038/s41565-017-0034-6.

The European search report issued on Sep. 26, 2024 for EP20956048. 1.

* cited by examiner

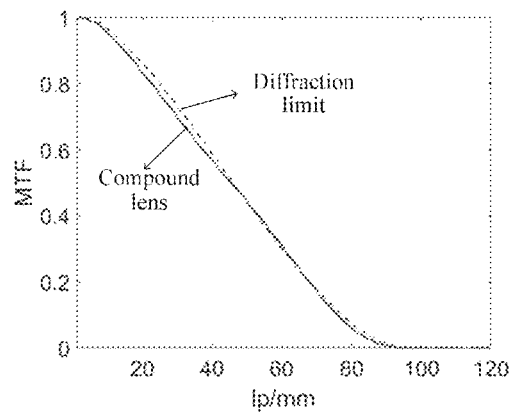

Figure 16

| A lens combination including a substrate and a lens is acquired, where the lens is connected to a first surface of the substrate | S101 |

↓

| A surface shape of the lens is acquired | S102 |

↓

| A first metasurface array is formed on a second surface of the substrate based on the surface shape, where the first metasurface array includes multiple metasurface units and the first surface is opposite to the second surface | S103 |

Figure 17

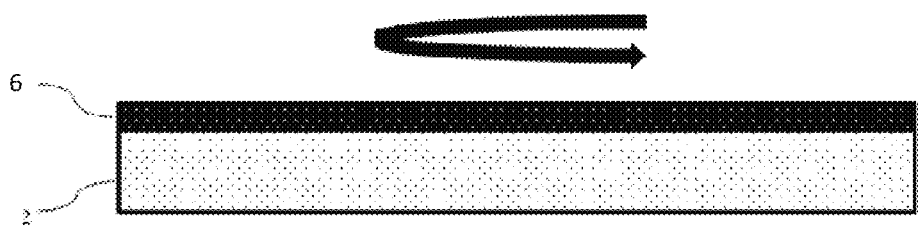

Figure 18

COMPOSITE LENS AND MANUFACTURING METHOD THEREFOR, AND INFRARED DETECTOR

The present application is a National Stage application of PCT international application PCT/CN2020/132653, filed on Nov. 30, 2020 which claims priority to Chinese Patent Application No. 202011053733.3, titled "COMPOSITE LENS AND MANUFACTURING METHOD THEREFOR, AND INFRARED DETECTOR", filed on Sep. 29, 2020 with the China National Intellectual Property Administration, both of which are incorporated herein by reference in their entireties.

FIELD

The present disclosure relates to the field of optical technology, and in particular to a compound lens, a method for manufacturing a compound lens and an infrared detector.

BACKGROUND

With the development of optical technology, large-scale integration, miniaturization and multifunctionality of optical devices have become new development goals.

Due to large volume and heavy weight of the conventional lens, a compound lens based on a metasurface is provided. The metasurface is a two-dimensional optical plane. Parameters, such as amplitude, a phase, and polarization, of an incident electromagnetic wave can be flexibly controlled by subwavelength structures arranged on the metasurface in a specific way. This arrangement breaks through electromagnetic properties of the conventional optical lens. At present, a compound lens based on a metasurface is as shown in FIG. 1. A metasurface array is arranged on a surface of a substrate. A spherical lens made of photoresist covers the metasurface array. Once the spherical lens is manufactured, a machining error cannot be corrected by modifying the metasurface array, thereby affecting the imaging effect of the compound lens.

Therefore, those skilled in the art should focus on how to solve the above technical problems.

SUMMARY

A compound lens, a method for manufacturing a compound lens and an infrared detector are provided according to the present disclosure to correct aberration caused by an surface shape machining error of the lens, so as to improve the imaging effect of the compound lens.

In order to solve the above technical problems, a compound lens is provided according to the present disclosure. The compound lens includes:
   a substrate;
   a lens arranged on a first surface of the substrate; and
   a first metasurface array arranged on a second surface of the substrate based on a surface shape of the lens, and the first metasurface array includes multiple metasurface units, where the first surface is opposite to the second surface.

In an embodiment, the compound lens further includes a bonding layer configured to connect the lens to the first surface of the substrate.

In an embodiment, in a case that the lens is a biconvex spherical lens, the compound lens further includes: a second metasurface array arranged on the first surface of the substrate, wherein the second metasurface array is arranged in a cavity formed by the biconvex spherical lens and the first surface, and the second metasurface array includes multiple metasurface units.

In an embodiment, the lens and the substrate are an integrated structure.

In an embodiment, the second surface of the substrate is a stepped surface, and the stepped surface is of bilateral symmetry.

In an embodiment, the metasurface unit is an axisymmetric metasurface unit.

A method for manufacturing a compound lens is further provided according to the present disclosure. The method includes:
   acquiring a lens combination including a substrate and a lens, where the lens is connected to a first surface of the substrate;
   acquiring a surface shape of the lens; and
   forming a first metasurface array on a second surface of the substrate based on the surface shape, where the first metasurface array includes multiple metasurface units and the first surface is opposite to the second surface.

In an embodiment, in a case that the lens is a biconvex spherical lens, the acquiring a lens combination including a substrate and a lens includes:
   acquiring the substrate;
   spin-coating a first photoresist on an upper surface of the substrate;
   processing the first photoresist through any one of grayscale photolithography, nanoimprint lithgraphy, laser direct writing lithgraphy and thermal reflow to form a pattern matching a first spherical surface of the biconvex spherical lens;
   etching the upper surface to form the first spherical surface of the biconvex spherical lens;
   spin-coating a second photoresist on a lower surface of the substrate;
   processing the second photoresist through any one of grayscale photolithography, nanoimprint lithgraphy, laser direct writing lithgraphy and thermal reflow to form a pattern matching a second spherical surface of the biconvex spherical lens; and
   etching the lower surface to form the second spherical surface of the biconvex spherical lens, and obtaining the biconvex spherical lens.

In an embodiment, after forming a first metasurface array on a second surface of the substrate based on the surface shape, the method further includes:
   forming a second metasurface array on the first surface of the substrate, where the second metasurface array includes multiple metasurface units; and
   bonding the biconvex spherical lens to the first surface of the substrate, where the second metasurface array is arranged in a cavity formed by the biconvex spherical lens and the first surface.

In an embodiment, in a case that the lens is a planoconvex spherical lens, the acquiring a lens combination including a substrate and a lens includes:
   acquiring the substrate;
   spin-coating a third photoresist on a first surface of the substrate;
   processing the third photoresist through any one of grayscale photolithography, nanoimprint lithgraphy, laser direct writing lithgraphy and thermal reflow to form a pattern matching a spherical surface of the planoconvex spherical lens; and etching the first surface to form the plano-convex spherical lens, so as to obtain the lens combination including the substrate and the lens.

In an embodiment, the acquiring a surface shape of the lens includes:

acquiring surface shape data of the lens by a profilometer; and fitting the surface shape data to obtain the surface shape.

In an embodiment, the forming a first metasurface array on a second surface of the substrate based on the surface shape includes:

modeling multiple candidate metasurface units with a finite difference time domain method; and obtaining, for each of the multiple candidate metasurface units, phases generated by the candidate metasurface unit at different incident wavelengths;

determining a dispersion provided by the metasurface unit based on the phases;

determining, based on the surface shape, a theoretical phase and a theoretical dispersion required by the lens at a preset position with a distance from a center of the lens; and selecting the metasurface units to be arranged on preset positions, from the multiple candidate metasurface units based on the theoretical phases, the theoretical dispersions, the phases and the dispersions, to form the first metasurface array.

In an embodiment, the acquiring the substrate includes:

acquiring a to-be-processed substrate;

covering, by a mask, a first preset area on an upper surface of the to-be-processed substrate; and etching the upper surface of the to-be-processed substrate, to make an area of the substrate not covered by the mask have a first height; and covering, by a mask, a second preset area on the upper surface of the to-be-processed substrate; etching the upper surface of the to-be-processed substrate, to make an area of the substrate not covered by the mask have a second height; and obtaining the substrate with a symmetrical stepped surface, where the second preset area covers the first preset area and is larger than the first preset area.

In an embodiment, each of the metasurface unit and the substrate is made of an SOI chip.

In an embodiment, an infrared detector is further provided according to the present disclosure. The infrared detector includes the compound lens according to any one of the above embodiments, a substrate wafer, a focal plane detector array, a readout circuit, a bonding section, and an electrode welding spot.

In the present disclosure, a compound lens is provided, which includes a substrate, a lens arranged on a first surface of the substrate, and a first metasurface array arranged on a second surface of the substrate based on a surface shape machining error of the lens, where the first metasurface array includes multiple metasurface units, and the first surface is opposite to the second surface.

The compound lens according to the present disclosure includes the substrate, the lens and the first metasurface array that are respectively arranged on the first surface and the second surface of the substrate, where the first surface is opposite to the second surface. Since the lens and the first metasurface array are respectively arranged on two different surfaces of the substrate, the first metasurface array may be arranged based on the surface shape machining error of the lens after the lens is manufactured, to correct aberration caused by the surface shape machining error in the lens processing process, so as to improve an imaging effect. In addition, since the first metasurface array is arranged after the lens is manufactured, the compound lens according to the present disclosure has a high tolerability for machining error.

In addition, a method for manufacturing the compound lens and an infrared detector are further provided according to the present disclosure, which have the above advantages.

BRIEF DESCRIPTION OF THE DRAWINGS

In order to clearly describe the technical solutions in the present disclosure or the technical solutions in the conventional technology, drawings to be used in the description of the embodiments or the conventional technology are briefly described hereinafter. It is apparent that the drawings described below are merely used for describing the embodiments of the present disclosure, and those skilled in the art may obtain other drawings according to the provided drawings without any creative effort.

FIG. 16 is a schematic diagram showing a comparison between a curve of an optical transfer function of a compound lens and a curve of a diffraction limit under an incident wavelength of 9.6 um;

FIG. 17 is a flowchart of a method for manufacturing a compound lens according to an embodiment of the present disclosure;

FIG. 18 to FIG. 20 are schematic diagrams showing a process of manufacturing a substrate and a lens according to an embodiment of the present disclosure;

DETAILED DESCRIPTION OF THE EMBODIMENTS

In order to make those skilled in the art understand solutions of the present disclosure better, the present disclosure is described in detail below in conjunction with the drawings and embodiments. Apparently, the embodiments described below are only some embodiments rather than all the embodiments of the present disclosure. Any other embodiments obtained by those skilled in the art based on the embodiments in the present disclosure without any creative effort fall within the protection scope of the present disclosure.

Many specific details are illustrated in following description to facilitate a full understanding of the present disclosure. The present disclosure may be implemented in another manner rather than those described herein. Those skilled in the art can analogize without departing from the scope of the present disclosure. Therefore, the present disclosure is not limited to the embodiments disclosed hereinafter.

As described in the background, in a conventional compound lens based on a metasurface, a metasurface array is arranged on a surface of a substrate of the compound lens. A spherical lens formed by photoresist covers the metasurface array. Once the spherical lens is manufactured, a machining error cannot be corrected by modifying the metasurface array, thereby affecting an imaging effect of the compound lens.

Figure 1:
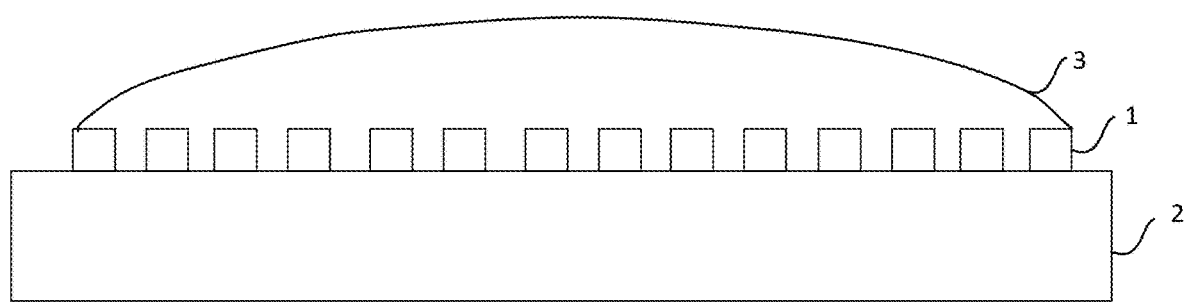
FIG. 1 is a schematic structural diagram of a compound lens based on a metasurface according to conventional technology.
Figure 2:
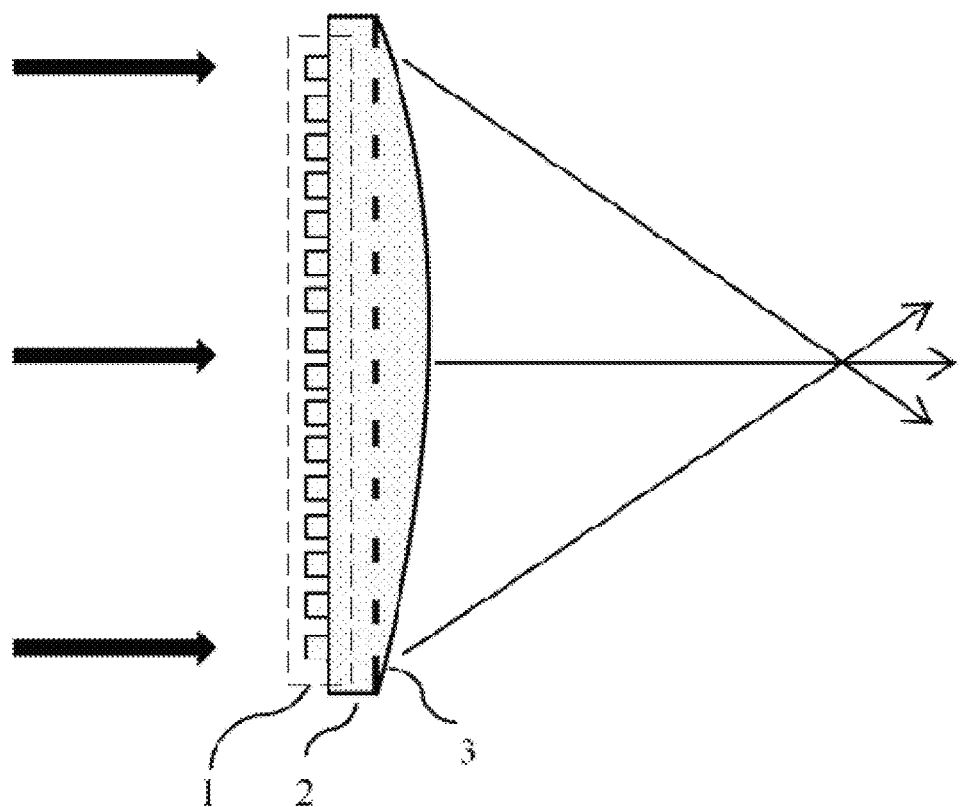
FIG. 2 is a schematic structural diagram of a compound lens according to an embodiment of the present disclosure.

In view of this, a compound lens is provided according to the present disclosure. Reference is made to FIG. 2, which is a schematic structural diagram of a compound lens according to an embodiment of the present disclosure. The compound lens includes a substrate 2, a lens 3 arranged on a first surface of the substrate 2; and a first metasurface array 1 arranged on a second surface of the substrate 2 based on a surface shape of the lens 3. The first metasurface array 1 includes multiple metasurface units. The first surface is opposite to the second surface.

It should be noted that materials of the substrate 2, the lens 3, and the first metasurface array 1 are not limited in the present disclosure, which depend on a wave band to which the compound lens 3 is applied. When the compound lens 3 is applied to a mid-infrared wave band or a far-infrared wave band, the substrate 2, the lens 3 and the first metasurface array 1 are all made of monocrystalline silicon. When the compound lens 3 is applied to a visible light wave band or a near-infrared band, the substrate 2 and the lens 3 are made of glass, and the first metasurface array 1 is made of amorphous silicon.

It should also be noted that the surface shape of the lens 3 is not limited in the present disclosure, which depends on actual conditions. For example, the lens 3 may be implemented as either a spherical lens or an aspherical lens.

The metasurface unit is a sub-wavelength structure unit. The number, a shape and a length of the metasurface unit in the first metasurface array 1 are not limited in the present disclosure, which depend on actual conditions.

For example, the lens 3 may be a plano-convex spherical lens 3. Reference is made to FIG. 2, in which the lens 3 and the substrate 2 is an integrated structure and an optical axis of the plano-convex spherical lens 3 coincides with an optical axis of the first metasurface array 1.

As an implementation, the compound lens 3 may further include a bonding layer.

The bonding layer is configured to connect the lens 3 to the first surface of the substrate 2. Taking the compound lens 3 shown in FIG. 2 as an example, a bonding layer is arranged between the substrate 2 and the lens 3.

Figure 3:
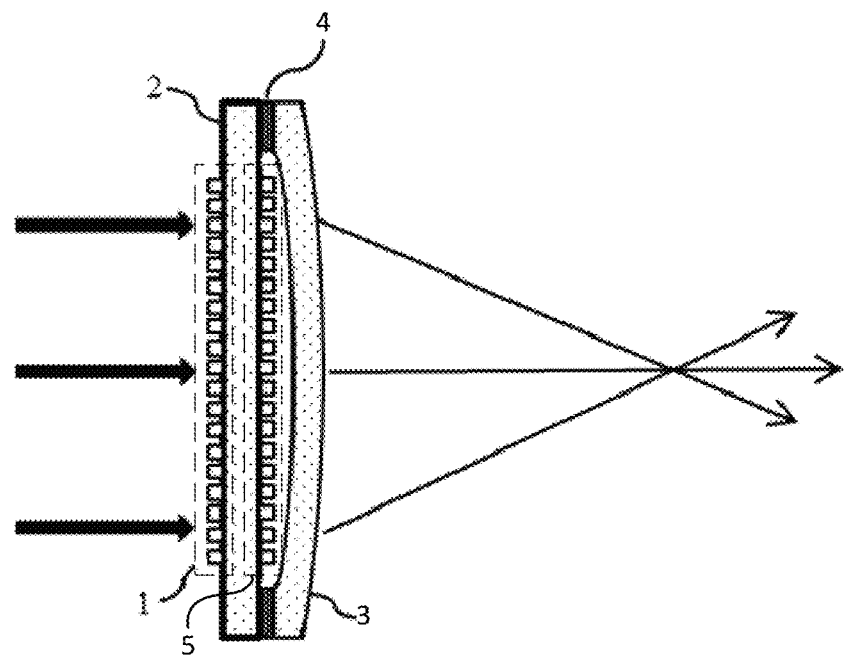
FIG. 3 is a schematic structural diagram of a compound lens according to another embodiment of the present disclosure.

Reference is made to FIG. 3, which is a schematic structural diagram of a compound lens 3 according to another embodiment of the present disclosure. In the case that the spherical lens 3 is implemented as a biconvex spherical lens 3, the compound lens 3 further includes a second metasurface array 5.

The second metasurface array 5 is arranged on the first surface of the substrate 2. The second metasurface array 5 is arranged in a cavity formed by the biconvex spherical lens 3 and the first surface. The second metasurface array 5 includes multiple metasurface units.

The bonding layer 4 is not limited in the present disclosure, which may be set as demand. For example, the bonding layer 4 may be implemented as a silicon-silicon bonding layer 4, a gold-silicon eutectic bonding layer 4, a gold-gold bonding layer 4 or the like.

It should be noted that the number, a shape and a length of the metasurface unit in the second metasurface array 5 are not limited in the present disclosure, which depend on actual conditions. When the compound lens 3 is applied to a mid-infrared wave band or a far-infrared wave band, the metasurface units in the second metasurface array 5 are all made of monocrystalline silicon. When the compound lens 3 is applied to a visible light wave band or a near-infrared band, the metasurface units in the second metasurface array 5 are all made of amorphous silicon.

With the compound lens 3 shown in FIG. 2, spherical aberration and chromatic aberration can be effectively eliminated. With an increase of an aperture of the compound lens 3, dispersion required by the compound lens 3 is significantly increased. Dispersion provided by the first metasurface array 1 in the compound lens 3 shown in FIG. 2 cannot meet a requirement for the compound lens 3. In view of this, the second metasurface array 5 is arranged in the compound lens 3, to provided dispersion required by the compound lens 3 together with the first metasurface array 1. In this way, the aperture of the compound lens 3 can be further increased and the compound lens 3 is applied more widely.

The compound lens 3 according to the present disclosure includes the substrate 2, the lens 3 and the first metasurface array 1 that are respectively arranged on the first surface and the second surface of the substrate 2, where the first surface is opposite to the second surface. Since the lens 3 and the first metasurface array 1 are respectively arranged on two different surfaces of the substrate 2, the first metasurface array 1 may be arranged based on the surface shape of the lens 3 after the lens 3 is manufactured, to correct aberration caused by the surface shape machining error of the lens 3 in the lens 3 processing process, so as to improve an imaging effect. In addition, since the first metasurface array 1 is arranged after the lens 3 is manufactured, the compound lens according to the present disclosure has a high tolerability for machining error.

Figure 4:
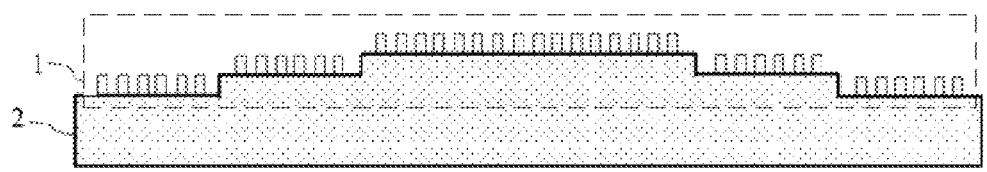
FIG. 4 is a schematic structural diagram of a first metasurface array and a substrate with a stepped surface according to an embodiment of the present disclosure.
Figure 5:
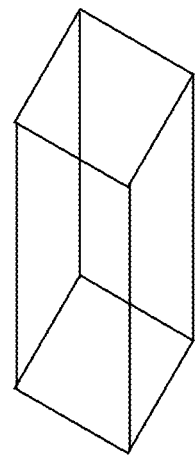
FIG. 5 to FIG. 12 are schematic structural diagrams each showing an axisymmetric metasurface unit according to an embodiment of the present disclosure.
Figure 6:
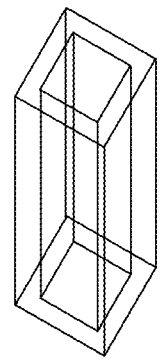
Figure 7:
Figure 8:
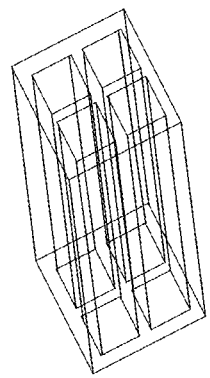
Figure 9:
Figure 10:
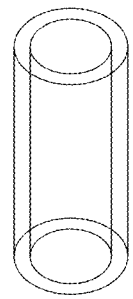
Figure 11:
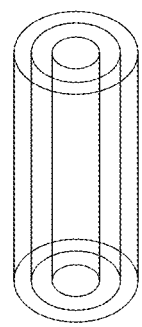
Figure 12:
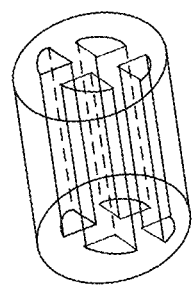

On the basis of any one of the above embodiments, another embodiment of the present disclosure is provided. Referring to FIG. 4, the second surface of the substrate 2 is a stepped surface, and the stepped surface is of bilateral symmetry.

It should be noted that the stepped surface of bilateral symmetry means that from the left to the middle of the second surface, there are the same number, the same height and the same step surface width of steps as from the right to the middle of the second surface. In this way, the stepped surface is symmetrical about a center line.

The multiple metasurface units of the first metasurface array 1 are arranged on different step surfaces.

Since the second surface is a stepped surface, the substrate 2 has areas with different thicknesses. Light has different optical path lengths in the areas with different thicknesses. The metasurface unit arranged in an area with a large thickness provides large dispersion and the metasurface unit arranged in an area with a small thickness provides small dispersion. In this way, a range between an upper limit and lower limit of the dispersion provided by the metasurface units is increased, so as to broaden a range of the dispersion provided by the metasurface units, thereby further increasing the aperture of the compound lens 3.

It can be understood that when the second metasurface array 5 is arranged on the first surface, the first surface may also be set as a bilateral symmetric surface in a stepped shape.

In an embodiment of the present disclosure, the metasurface unit is axisymmetric, to reduce sensitivity of the compound lens 3 to polarization state of an incident electromagnetic wave.

It should be noted that a shape of the axisymmetric metasurface unit includes but is not limited to a square column, a square ring, a cross, a shape of 田, a cylinder, a circular ring, a combination of a circular ring and a cylinder, and a circular cross. Schematic structural diagrams of the above shapes are as shown in FIG. 5 to FIG. 12 respectively. The axisymmetric metasurface unit has a depth same as the height.

Axisymmetric metasurface units in different shapes have different degrees of freedom in size. The adjustable degree of freedom in size of the axisymmetric metasurface unit is from 1 to 3. For example, for the metasurface unit in a shape of a square column, the degree of freedom is 1, which refers to a side length of a square section. For the metasurface unit in a shape of a square ring, the degree of freedom is 2, which refers to side lengths of two square sections. For axisymmetric metasurface units in a certain shape, sizes of the axisymmetric metasurface units vary in a specific size step within an allowable size range to obtain a metasurface unit database including a large number of metasurface units.

In order to simplify a process of manufacturing the axisymmetric metasurface units, heights of the axisymmetric metasurface units are set to be constant.

Taking the compound lens 3 shown in FIG. 2 as an example, a designed focal length is 5 mm and incident wave band is controlled from 8 μm to 12 μm, performance of the compound lens 3 is characterized as following.

Figure 13:
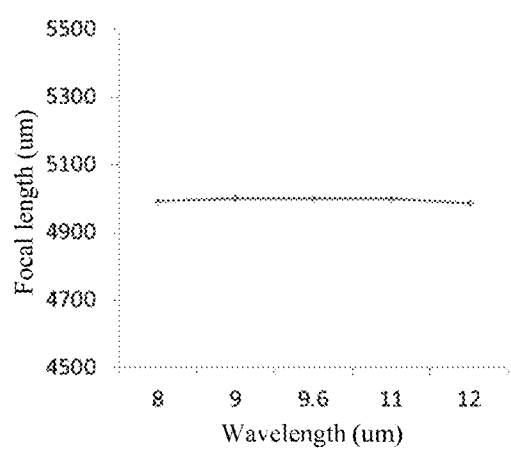
FIG. 13 is a schematic distribution diagram showing focal lengths of a compound lens under different incident wavelengths.
Figure 14:
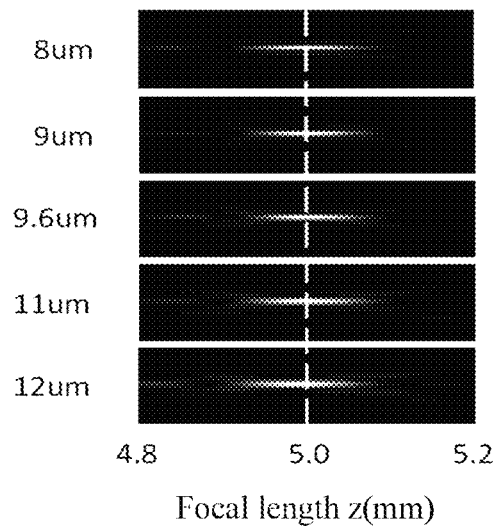
FIG. 14 is a schematic distribution diagram showing light intensity on an XZ plane behind a lens under different incident wavelengths.

Referring to FIG. 13, an abscissa denotes an incident wavelength and an ordinate denotes a focal length. It can be concluded that a shift rate of the focal length with the incident wavelength is 0.26% and all waves with wavelengths within the wave band converge within 5 mm of the designed focus length. Further combining the light intensity distribution on an XZ plane behind the lens 3 under different incident wavelengths shown in FIG. 14, chromatic aberration is effectively eliminated by the compound lens 3.

Figure 15:
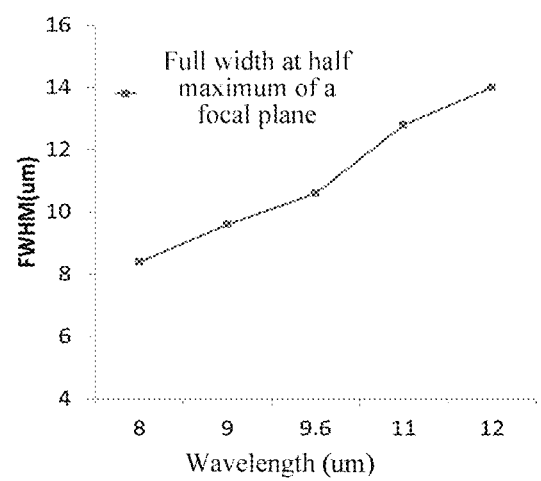
FIG. 15 is a schematic diagram showing the full widths at half maximum of a focal plane of a compound lens under different incident wavelengths.

Referring to FIG. 15, an abscissa denotes an incident wavelength and an ordinate denotes a full width at half maximum of a focal plane of the lens 3. Full widths at half maximum under different incident wavelengths range from 8 μm to 14 μm, which indicates that the incident waves converge well at the focus and the lens has high resolution.

Referring to FIG. 16, an abscissa denotes a spatial frequency and an ordinate denotes an optical transfer function. In the case of an incident wavelength of 9.6 um, when a value of the optical transfer function is reduced to 0.1, a spatial frequency corresponds to the optical transfer function is 1p/mm. Curves in FIG. 16 shows that the compound lens 3 has high resolution, and the diffraction limit is almost approached.

A method for manufacturing a compound lens is further provided according to the present disclosure. Reference is made to FIG. 17, which is a flowchart of a method for manufacturing a compound lens according to an embodiment of the present disclosure. The method includes the following steps S101 to S103.

In step S101, a lens combination including a substrate and a lens is acquired, where the lens is connected to a first surface of the substrate.

In step S102, a surface shape of the lens is acquired.

In step S103, a first metasurface array is formed on a second surface of the substrate based on the surface shape. The first metasurface array includes multiple metasurface units and the first surface is opposite to the second surface.

The surface shape of the lens is not limited in the present disclosure. For example, the lens may be a spherical lens or an aspherical lens. Taking a spherical lens as an example, a method for manufacturing a compound lens is described for different types of spherical lens.

In the case that the lens is implemented as a plano-convex spherical lens, the method for manufacturing the compound lens includes the following steps S201 to S206.

In step S201, the substrate is acquired.

In step S202, a third photoresist is spin-coated on a first surface of the substrate.

For step S202, reference is made to FIG. 18, in which the third photoresist 6 is spin-coated on an upper surface of the substrate.

In step S203, the third photoresist is processed through any one of grayscale photolithography, nanoimprint lithgraphy, laser direct writing lithography and thermal reflow to form a pattern matching a spherical surface of the plano-convex spherical lens.

Figure 19:
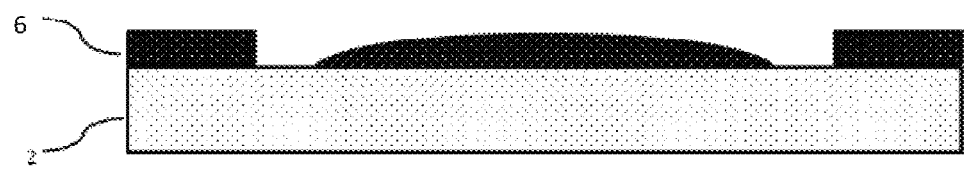

In this step S203, grayscale photolithography is taking as an example for description. A photolithography mask is arranged on the third photoresist for photolithography. Dissolution degrees of the third photoresist at different positions are different, so that a gradient of thickness is formed on the surface of the substrate and the third photoresist remained at a center is thicker than that at edges, as shown in FIG. 19.

Processes of the nanoimprint lithgraphy, laser direct writing lithography and the thermal reflow are well known to those skilled in the art, which will not be described in detail herein.

In step S204, the first surface is etched to form the plano-convex spherical lens, so as to obtain the lens combination including the substrate and the lens.

Figure 20:
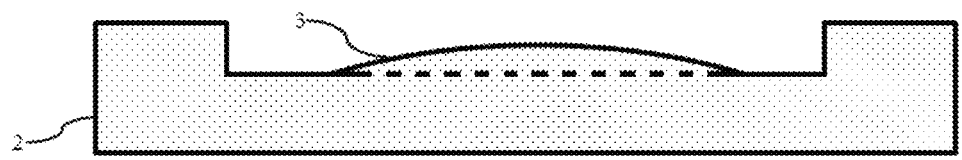

In this step S204, the third photoresist at different positions have different thicknesses. Dry etching is performed on the first surface on which the third photoresist is coated. Since the third photoresist at edges is thinner than that at the center, an etching depth at edges is significantly greater than that at the center, so as to form a spherical surface, as shown in FIG. 20. The lens included in the lens combination in this step is implemented as a plano-convex spherical lens.

In step S205, the surface shape of the spherical lens is acquired.

In an embodiment, the surface shape of the spherical lens is acquired by performing steps S2051 and S2052.

In step S2051, surface shape data of the lens is acquired by a profilometer.

In step S2052, the surface shape data is fit to obtain the surface shape.

The surface shape data may also be measured by a step profiler. For example, the surface shape of the plano-convex spherical lens is an ellipsoid surface. After the surface shape data is obtained, the surface shape data is fit using an ellipsoid surface equation to obtain the surface shape.

The ellipsoid surface equation may be expressed as $$\frac{x^2}{14} + \frac{y^2}{13.702^2} = 1.$$

The ellipsoid surface equation indicates that when the first surface is etched to form the spherical lens, a rate of etching the edges is faster than a rate of etching the center.

Etching selectivity ratio is a manufacturing parameter that determines a shape of the lens. Assuming that for a certain position at a distance of r from a center of a circle of a bottom surface of the spherical lens, a thickness of the photoresist is represented by $\delta(r)$, a theoretical etching depth is represented by $H(r)$, a theoretical etching selectivity ratio is represented by $\eta_0$, there is an equation expressed as $\delta(r)*\eta_0=H(r)$. In actual manufacturing, the etching selectivity ration changes with the position, resulting in a machining error. Therefore, the surface shape of the spherical lens having the machining error is measured.

In step S206, a first metasurface array is arranged on a second surface of the substrate based on the surface shape. The first metasurface array includes multiple metasurface units. The first surface is opposite to the second surface.

It can be understand that in this step the surface shape is acquired after the lens is manufactured. The lens requires different phases and different dispersions at different positions. For each position of the substrate on which the metasurface unit is required to be arranged, a metasurface unit providing a phase and a dispersion respectively closest to a theoretical phase and a theoretical dispersion required by the position is searched for in the metasurface unit database, and the metasurface unit is arranged on the position to obtain multiple metasurface units corresponding to multiple positions. The multiple metasurface units are arranged on the multiple positions of the substrate to form the first metasurface structure array, so as to correct the aberration caused by the surface shape machining error.

Figure 21:
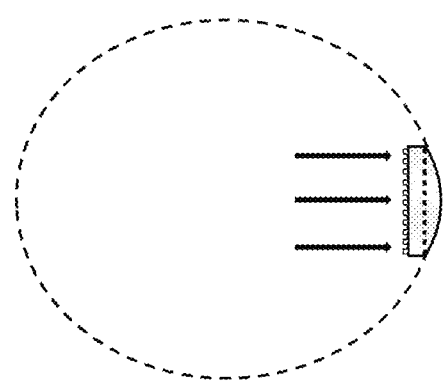
FIG. 21 is a schematic diagram showing a surface shape of a compound lens with a machining error.
Figure 22:
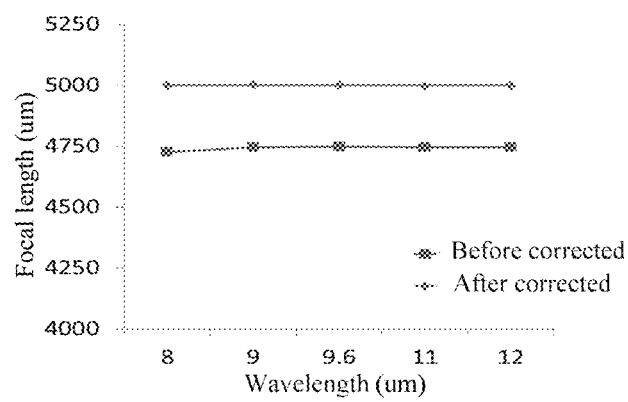
FIG. 22 is a schematic distribution diagram showing focal lengths of a compound lens with a machining error corrected by a first metasurface array and focal lengths of the compound lens without correction of the machining error under different incident wavelengths.

Taking the compound lens shown in FIG. 2 as an example, a designed focal length is 5 mm and an incident wave band is from 8 μm to 12 μm. The imaging effect of the compound lens in the present disclosure is simulated by taking a case in which correction is performed in an ellipsoid surface equation as an example. FIG. 21 is a schematic diagram showing a surface shape of the compound lens with an error. In this case, a major axis of the ellipse is in a horizontal direction and a minor axis of the ellipse is in a vertical direction. FIG. 22 is a schematic distribution diagram showing focal lengths of a compound lens with a machining error corrected by a first metasurface array and focal lengths of the compound lens without correction of the machining error under different incident wavelengths. An abscissa denotes the incident wavelength, and an ordinate denotes the focal length. It can be seen from FIG. 21 and FIG. 22 that the lens has an ellipsoid surface due to the machining error, improving a convergence ability of the lens. The focus length of the compound lens without correction is smaller than the designed focus length. The focus length of the corrected compound lens is almost identical to the designed focus length. In this case, a focus shift ratio in an operation bandwidth is 0.048%.

In an embodiment, the first metasurface array is formed on the second surface of the substrate based on the surface shape by performing the following steps S2061 to S2064.

In step S2061, multiple candidate metasurface units are modeled with a finite difference time domain (FDTD) method; and for each of the multiple candidate metasurface units, phases provided by the candidate metasurface unit at different incident wavelengths are obtained.

The shape of the multiple candidate metasurface units includes but is not limited to the eight axisymmetric shapes with different sizes described above. The multiple candidate metasurface units are modeled with the finite difference time domain (FDTD) method, and the multiple candidate metasurface units with respective sizes are scanned. In this way, for each of the multiple candidate metasurface units, phases and transmissivities generated by the metasurface unit for incident electromagnetic waves are obtained at different incident wavelengths.

In step S2062, for each of the multiple candidate metasurface units, a dispersion provided by the candidate metasurface unit is determined based on the phases provided by the candidate metasurface unit.

The dispersion is a difference between a phase corresponding to a maximum wavelength within the incident wave band and a phase corresponding to a minimum wavelength within the incident wave band. For example, in the case that t the incident wave band is from 8 μm to 12 μm, during scanning with the FDTD method, a difference between a phase corresponding to a wavelength of 8 μm and a phase corresponding to a wavelength of 12 μm is calculated to obtain the dispersion provided by the candidate metasurface unit. Further, a central angular frequency corresponds to a wavelength of 9.6 μm within the wave band. In the case of an incident wave with a wavelength of 9.6 μm, phases provided by the candidate metasurface units are defined as a reference phase of the arranged metasurface units. A database is established based on the candidate metasurface units with different sizes and phases provided by each of the candidate metasurface units at different wavelengths.

In step S2063, a theoretical phase and a theoretical dispersion required by the lens at a preset position with a distance from a center of the lens is determined based on the surface shape.

The preset position is a position on which the metasurface unit is required to be arranged.

A single layer of the metasurface array functions as a convergent lens. The theoretical phase is calculated according to the following equation (1).

$$\varphi(r) = \frac{2\pi}{\lambda}\left(f - \sqrt{r^2 + f^2}\right) \tag{1}$$

In equation (1), φ(r) represents the theoretical phase, f represents the focus length, λ represents an incident wavelength, and r represents a distance from the preset position to the center of the compound lens.

The theoretical dispersion is calculated according to the following equation (2).

$$\Delta\varphi(r) = \left(\frac{2\pi}{\lambda_{min}} - \frac{2\pi}{\lambda_{max}}\right) \times \left(f - \sqrt{(r^2 + f^2)}\right) \quad (2)$$

In equation (2), Δφ(r) represents the theoretical dispersion, f represents the focus length, $\lambda_{min}$ represents a minimum wavelength within the incident wave band, $\lambda_{max}$ represents a maximum wavelength within the incident wave band, and r represents a distance from the preset position to the center of the compound lens.

After the surface shape data of the lens is acquired, optimization is performed using software according to equations (1) and (2) to obtain respective theoretical phases and respective theoretical dispersions corresponding to positions on the second surface of the substrate of the compound lens. In step S2064, metasurface units to be arranged on the preset positions are selected from the candidate metasurface units based on the theoretical phases, the theoretical dispersions, the phases and the dispersions to form the first metasurface array.

The metasurface units to be arranged on the preset positions are determined by matching phases provided by the candidate metasurface units with the theoretical phases required by the lens at the preset positions and matching dispersions provided by the candidate metasurface units with the theoretical dispersions required by the lens at the preset positions.

In the case that the lens is implemented as a biconvex spherical lens, the method for manufacturing the compound lens includes the following steps S301 to S311.

In step S301, the substrate is acquired.

In step S302, a first photoresist is spin-coated on an upper surface of the substrate.

Figure 23:
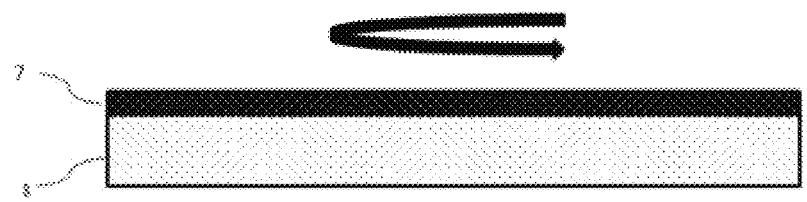
FIG. 23 to FIG. 28 are schematic diagrams showing a process of manufacturing a substrate and a lens according to another embodiment of the present disclosure.

For the step S302, reference is made to FIG. 23, in which the first photoresist 7 is spin-coated on the upper surface of the substrate 8.

In step S303, the first photoresist is processed through any one of grayscale photolithography, nanoimprint lithgraphy, laser direct writing lithgraphy and thermal reflow to form a pattern matching a first spherical surface of the biconvex spherical lens.

Figure 24:
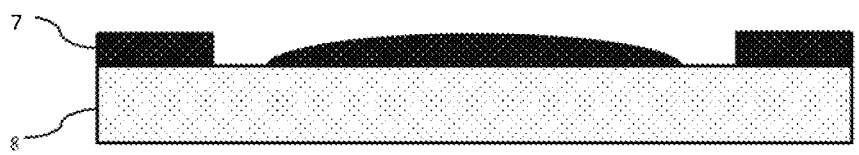

In this step S303, grayscale photolithography is taking as an example for description. A photolithography mask is arranged on the first photoresist for photolithography. The first photoresist remained at a center is thicker than the first photoresist remained at edges, as shown in FIG. 24.

Processes of the nanoimprint lithgraphy, laser direct writing lithgraphy and the thermal reflow are well known to those skilled in the art, which will not be described in detail here.

In step S304, the upper surface is etched to form the first spherical surface of the biconvex spherical lens.

Figure 25:
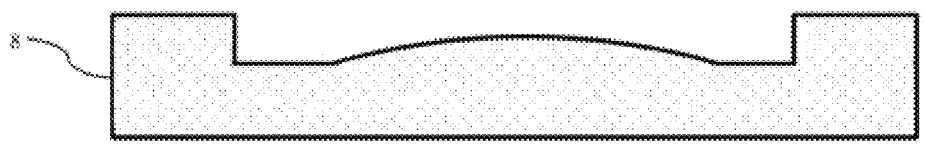

For the step S304, reference is made to FIG. 25, in which the upper surface is etched by dry etching.

In step S305, a second photoresist is spin-coated on a lower surface of the substrate.

Figure 26:
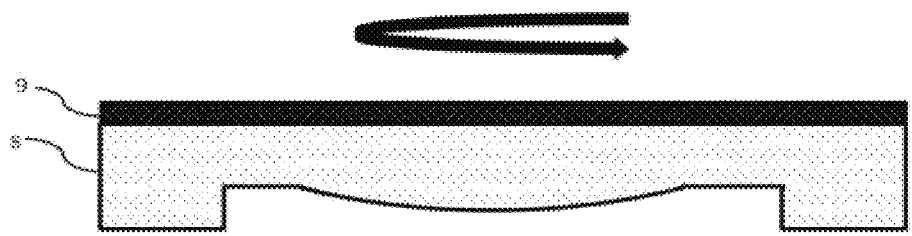

For this step S305, reference is made to FIG. 26, in which the second photoresist 9 is spin-coated on the lower surface of the substrate 8 with an etched upper surface.

In step S306, the second photoresist is processed through any one of grayscale photolithography, nanoimprint lithgraphy, laser direct writing lithgraphy and thermal reflow to form a pattern matching a second spherical surface of the biconvex spherical lens.

Figure 27:
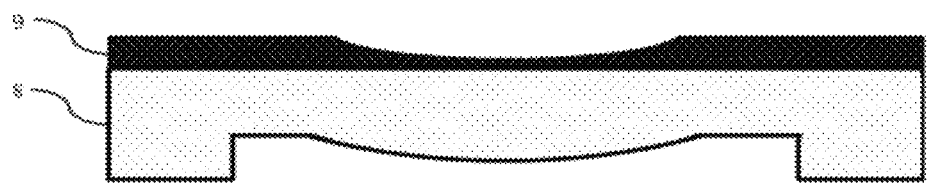

In this step S306, grayscale photolithography is taking as an example for description. A photolithography mask is arranged on the second photoresist for photolithography, as shown in FIG. 27.

In step S307, the lower surface is etched to form the second spherical surface of the biconvex spherical lens, so as to obtain the biconvex spherical lens.

Figure 28:
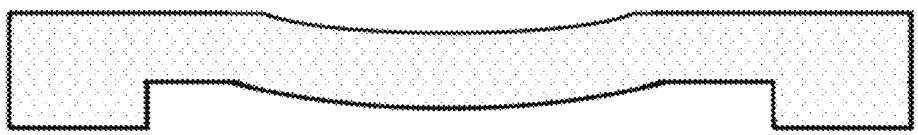

For the step S307, reference is made to FIG. 28, in which the lower surface is etched by dry etching to form the second spherical surface, so as to obtain the biconvex spherical lens.

In step S308, a surface shape of the biconvex spherical lens is acquired.

The process of step S308 may refer to the above embodiments, which will not be described in detail here.

In step S309, a first metasurface array is formed on the second surface of the substrate based on the surface shape. The first metasurface array includes multiple metasurface units and the first surface is opposite to the second surface.

The process of step S309 may refer to the above embodiments, which will not be described in detail herein.

In step S310, a second metasurface array is formed on the first surface of the substrate. The second metasurface array includes multiple metasurface units.

Figure 29:
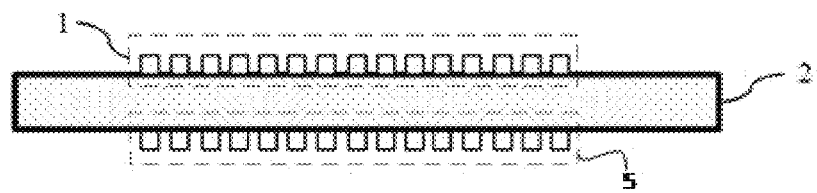
FIG. 29 is a schematic structural diagram of a substrate on which a first metasurface array and a second metasurface array are arranged.

It can be understood that a principle of forming the second metasurface array is the same as a principle of forming the first metasurface array. Thus, the process of forming the second metasurface array may refer to the process of forming the first metasurface array described above, which will not be described in detail herein. A schematic structural diagram of the substrate 2 on which the first metasurface array 1 and the second metasurface array 5 are arranged is as shown in FIG. 29.

In step S311, the biconvex spherical lens is connected to the first surface of the substrate in a bonding mode. The second metasurface array is arranged in a cavity formed by the biconvex spherical lens and the first surface.

In an embodiment, the bonding mode may include any one of silicon-silicon direct bonding, eutectic bonding and metal thermal compression bonding.

Specifically, the first surface of the biconvex spherical lens and the substrate are cleaned and activated. When the silicon-silicon bonding is applied, a polished surface of the biconvex spherical lens is attached to a polished surface of the first surface at room temperature due to a short-range intermolecular force. Then, high temperature annealing is performed on the attached structure for several hours in an environment of oxygen or nitrogen, and physical-chemical reaction occurs at an interface, so as to improve an overall bonding strength. When metal thermal compression bonding is applied, gold is grown at bonding positions of the biconvex spherical lens and the first surface, and then biconvex spherical lens and the first surface is bonded. When eutectic bonding is applied, gold is grown at a bonding position of the biconvex spherical lens or the first surface, and gold-silicon eutectic bonding is performed. Then the bonded structure is sliced to remove a redundant structure, so as to obtain the compound lens as shown in FIG. 3.

When the compound lens is applied to a mid-infrared wave band or a far-infrared wave band, the lens is made of monocrystalline silicon. The lens is manufactured completely using a semiconductor process such as the aforementioned grayscale photolithography, electron beam exposure and dry etching rather than using other conventional process. In the conventional technology, a lens made of photoresist is required to be manufactured using the laser femtosecond technology. Thus, the semiconductor processing process of the present disclosure has a higher manufacturing efficiency and a lower cost.

In addition, since the lens of the conventional compound lens based on a metasurface array is made of photoresist, the lens is required to be connected to and assembled with the metasurface. Stability at the interface and an assembly error obviously affect the imaging effect and stability of the compound lens. In the present disclosure, when the compound lens is applied to an infrared wave band or a far-infrared wave band, the substrate, the lens and the first metasurface array are all made of monocrystalline silicon. Thus, the compound lens may be made from a same piece of silicon without manufacturing two parts separately and assembling them.

The compound lens obtained by performing the method for manufacturing a compound lens according to the present disclosure includes the substrate, the lens and the first metasurface array that are respectively arranged on the first surface and the second surface of the substrate, where the first surface is opposite to the second surface. Since the lens and the first metasurface array are respectively arranged on two different surfaces of the substrate, the first metasurface array may be arranged based on the surface shape of the lens after the lens is manufactured, to correct aberration caused by the surface shape error of the lens in the lens processing process, so as to improve the imaging effect. In addition, since the first metasurface array is arranged after the lens is manufactured, the compound lens according to the present disclosure has a high tolerability for machining error.

In an embodiment of the present disclosure, the substrate is acquired by the following steps S401 to S403.

In step S401, a to-be-processed substrate is acquired.

In step S402, a first preset area at a middle part of an upper surface of the to-be-processed substrate is covered by a mask. The upper surface of the to-be-processed substrate is etched, to make an area of the substrate not covered by the mask have a first height.

Figure 30:
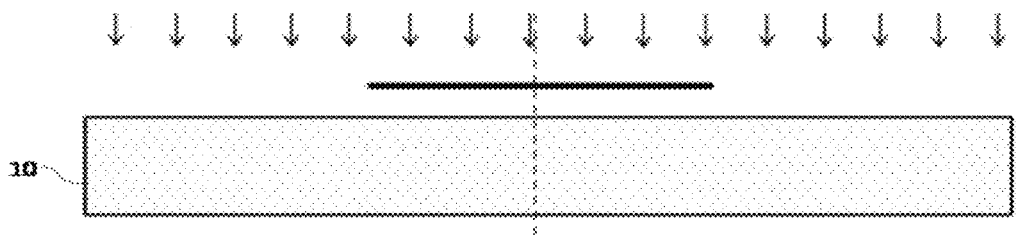
FIG. 30 to FIG. 32 are schematic diagrams showing a process of manufacturing a substrate according to an embodiment of the present disclosure.

Referring to FIG. 30, the first preset area in this step is symmetrical about a center line of the upper surface of the to-be-processed substrate 10.

In step S403, a second preset area on the upper surface of the to-be-processed substrate is covered by a mask. The upper surface of the to-be-processed substrate is etched, to make an area of the substrate not covered by the mask have a second height. Thus, the substrate with a symmetrical stepped surface. The second preset area covers the first preset area and is larger than the first preset area.

Figure 31:
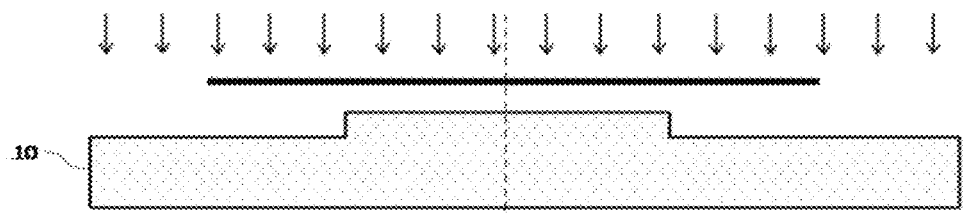
Figure 32:
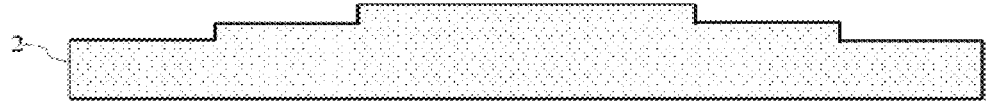

Referring to FIG. 31, the second preset area in this step is formed by expanding out the first preset area evenly, so that the second preset area is similarly symmetrical about the center line of the upper surface of the to-be-processed substrate. The obtained substrate with a stepped surface is as shown in FIG. 32.

In order to facilitate manufacturing, a difference between the first height and the second height, i.e., a height difference between adjacent steps, is from 1 um to 2 um.

The center of the substrate has a maximum thickness and the metasurface unit arranged on the center of the substrate provides a maximum dispersion. The edge of the substrate has a minimum thickness and the metasurface unit arranged on the edge of the substrate provides a minimum dispersion. A dispersion at the edge of the lens may be designed to be the minimum dispersion provided by the metasurface unit. The dispersion requirement gradually increases from the edge of the lens to the center of the lens. A maximum dispersion provided by the lens depends on the maximum dispersion provided by the metasurface unit on the center of the substrate.

A process of manufacturing a substrate with three steps is provided in this embodiment. The number of steps is not limited in the present disclosure, which depends on actual conditions.

On the basis of the above embodiments, in an embodiment of the present disclosure, each of the metasurface unit and the substrate is made of a silicon-on-insulator (SOI) chip. $SiO_2$ serves as an etching barrier layer to control heights of all metasurface units and depths of inner holes of all metasurface units to be a specified height, to avoid inconsistency of etching heights of the metasurface units.

When the lens and the substrate are an integrated structure, the first metasurface array, the lens and the substrate are all made of SOI chip. When the compound lens is provided with a bonding layer, as shown in FIG. 3, the first metasurface array and the substrate are made of SOI chip and the biconvex spherical lens is made of other material.

The reason for the above situation is that the metasurface unit includes holes with a small size, and thus the metasurface unit has a large depth-width ratio. A load effect during the etching may affect uniformity of deep silicon etching. Reactive ions in a graphics intensive area consume faster than reactive ions in a graphics non-intensive area, which decreases an etching speed, thereby resulting in inconsistency of etching heights of the metasurface units.

A process of manufacturing the metasurface unit using an SOI chip is described below.

In step S501, an upper silicon in a silicon wafer including an embedded oxide layer is polished to make the upper silicon have a thickness equal to the height of the metasurface unit.

Figure 33:
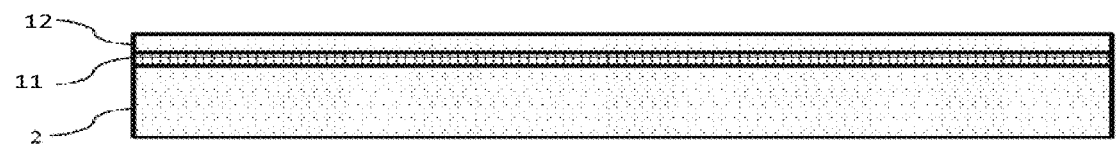
FIG. 33 to FIG. 38 are schematic diagrams showing a process of manufacturing metasurface units using SOI technology according to an embodiment of the present disclosure.

Referring to FIG. 33, the thickness of the upper silicon 12 is equal to the height of the metasurface unit. A thickness of the embedded oxide layer 11 in the silicon wafer ranges from 50 nm to 200 nm. The embedded oxide layer 11 with too large thickness will affect transmissivity of the compound lens.

In step S502, a fourth photoresist is spin-coated on an upper surface of the silicon wafer, and a photolithography mask is arranged on the fourth photoresist to perform photolithography on the fourth photoresist.

Figure 34:
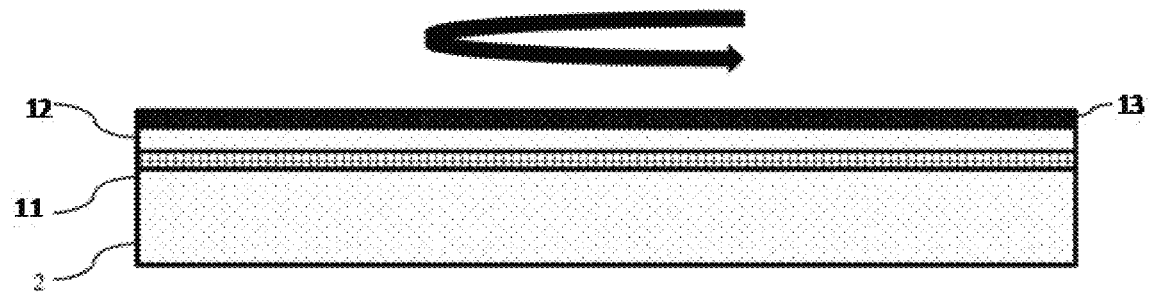
Figure 35:
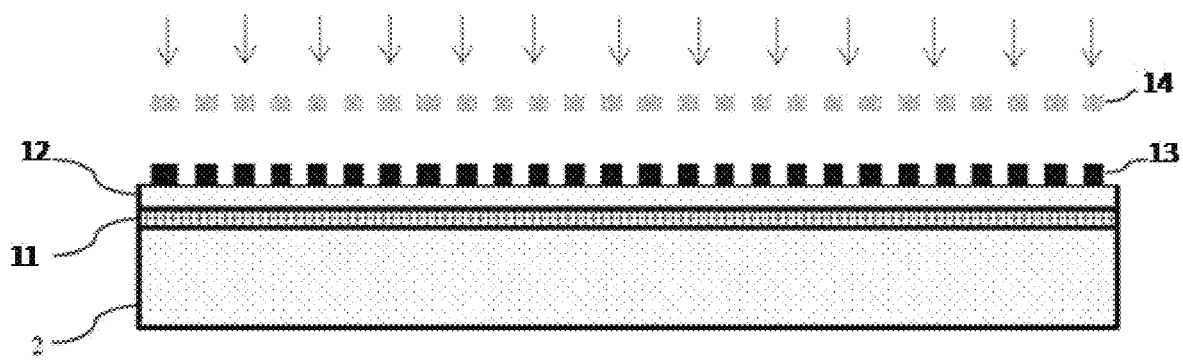

For the step S502, reference is made to FIG. 34 and FIG. 35. The fourth photoresist 13 is spin-coated on the upper surface of the upper silicon 12, and the photolithography mask 14 is arranged on the fourth photoresist 13 for photolithography.

In step S503, dry etching is performed on the upper silicon by using the remaining fourth photoresist as a mask, to obtain metasurface units with the same height.

Figure 36:
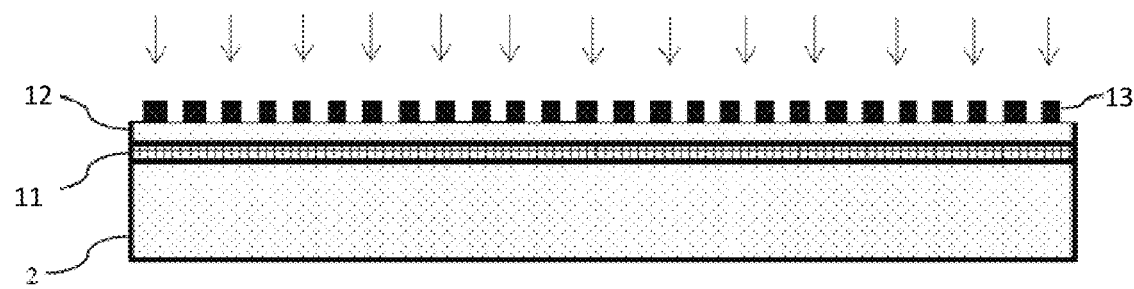
Figure 37:
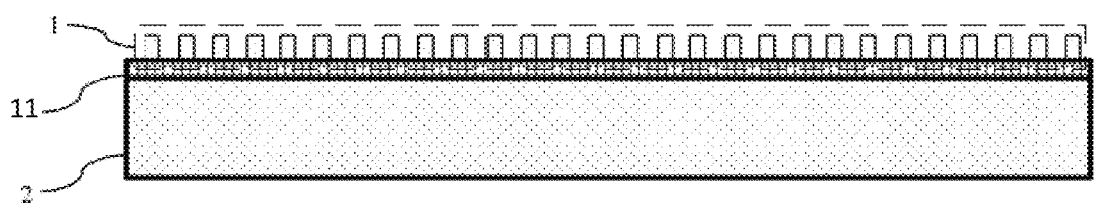

For the step S503, reference is made to FIG. 36 and FIG. 37. Due to the embedded oxide layer 11, the heights of all metasurface units are controlled to be equal to the thickness of the upper silicon.

In step S504, the embedded oxide layer in an open area is removed by a dry process or a wet process.

Figure 38:
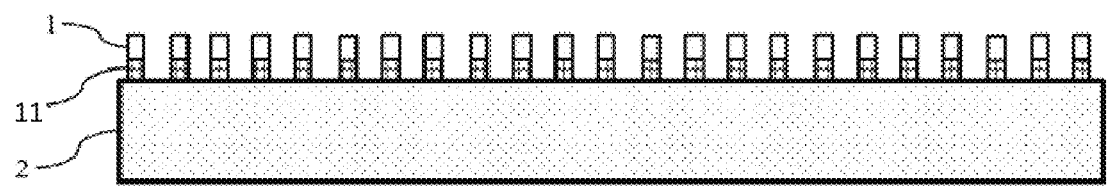

For the step S504, reference is made to FIG. 38. The embedded oxide layer 11 in the open area is removed to avoid the decrease of transmissivity caused by the embedded oxide layer 11.

It should be noted that when the compound lens includes both the first metasurface array and the second metasurface array, metasurface units of the first metasurface array are manufactured on a silicon wafer including an embedded oxide layer and metasurface units of the second metasurface array are manufactured on another silicon wafer including an embedded oxide layer, then the two silicon wafers including the embedded oxide layer are bonded to each other.

Figure 39:
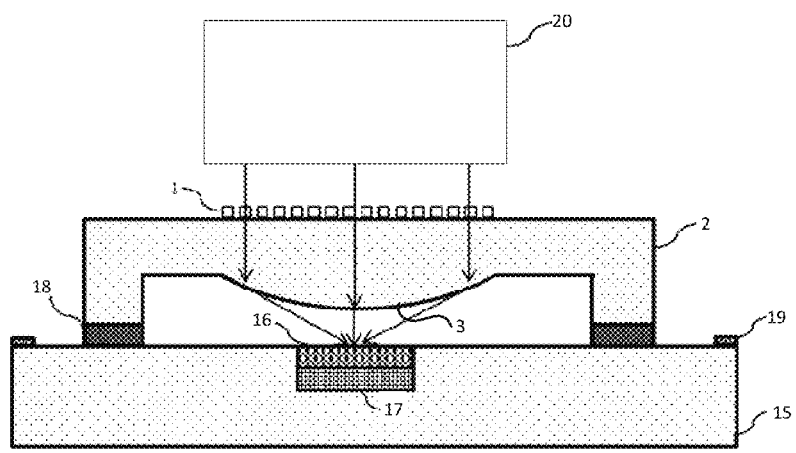
FIG. 39 is a schematic structural diagram of an infrared detector according to an embodiment of the present disclosure.

An infrared detector is further provided according to the present disclosure. Referring to FIG. 39, the infrared detector includes the compound lens according to any one of the above embodiments, a substrate wafer 15, a focal plane detector array 16, a readout circuit 17, a bonding section 18, and an electrode welding spot 19.

The compound lens covers the substrate wafer 15 through the bonding section 18. The bonding section 18 serves as a silicon window for sealing and protection. The focal plane detector array 16 and the readout circuit 17 are directly grown on the substrate wafer 15 using monolithic integration technology, and the electrode welding spot 19 is used to connect with an external circuit.

In an embodiment, the infrared detector further includes an infrared lens group 20. The infrared lens group 20 includes an optical lens. Reference may be made to conventional infrared detectors.

Incident infrared light is transmitted through the first metasurface array 1 of the infrared detector and the lens 3, and focuses on the focal plane detector array 16. The focal plane detector array 16 includes a large number of optical signal detectors configured to convert an optical signal into an electrical signal within an integration time period. The readout circuit 17 is configured to perform integration, reading out, noise removal, and reshaping on a signal, and then output the signal to the substrate wafer 15 through an internal pin.

Due to the first metasurface array, the number of conventional optical lenses required in the infrared lens group is reduced, or even the infrared lens group is unnecessary, which reduces a mass, a volume, and a cost of the infrared detector. With the infrared detector according to the present disclosure, an applicable wave band of incident infrared waves is extended, an aperture of the infrared detector that can eliminate aberration is extended, and an imaging range of the infrared lens group is broaden. In addition, aberration produced by the infrared lens group during manufacturing or other processes can be flexibly corrected, and sensitivity of the infrared detector is improved.

It should be noted that for the infrared detector shown in FIG. 39, the positions of the first metasurface array 1 and the lens 3 in the compound lens can be exchanged.

The embodiments of the present disclosure are described in a progressive manner, each embodiment focuses on differences from other embodiments, and the same or similar parts between the various embodiments may be referred to each other. For the device disclosed in the embodiments, since the principle is the same as the method disclosed in the embodiments, the description is relatively simple, and the relevant parts can be referred to the description of the method.

The compound lens, the method for manufacturing the compound lens and the infrared detector according to the present disclosure are descried in detail above. Principles and embodiments of the present disclosure are described herein through specific examples. Description of the above embodiments is merely used to facilitate understanding the method and concept of the present disclosure. It should be noted that several improvements and modifications can be made to the present disclosure by those skilled in the art without departing from the principles of the present disclosure. These improvements and modifications shall fall within the scope of the claims of the present disclosure.

The invention claimed is:

1. A compound lens, comprising:
    a substrate;
    a lens arranged on a first surface of the substrate; and
    a first metasurface array arranged on a second surface of the substrate based on a surface shape of the lens, wherein the first metasurface array comprises a plurality of metasurface units, and
    wherein the first surface is opposite to the second surface.

2. The compound lens according to claim 1, further comprising:
    a bonding layer configured to connect the lens to the first surface of the substrate.

3. The compound lens according to claim 2, wherein in a case that the lens is a biconvex spherical lens, the compound lens further comprises:
    a second metasurface array arranged on the first surface of the substrate, wherein the second metasurface array is arranged in a cavity formed by the biconvex spherical lens and the first surface; and
    wherein the second metasurface array comprises a plurality of metasurface units.

4. The compound lens according to claim 1, wherein the lens and the substrate are an integrated structure.

5. The compound lens according to claim 1, wherein the second surface of the substrate is a stepped surface, and the stepped surface is of bilateral symmetry.

6. The compound lens according to claim 1, wherein the metasurface unit is an axisymmetric metasurface unit.

7. A method for manufacturing a compound lens, comprising:
    acquiring a lens combination comprising a substrate and a lens, wherein the lens is connected to a first surface of the substrate;
    acquiring a surface shape of the lens;
    forming a first metasurface array on a second surface of the substrate based on the surface shape, wherein the first metasurface array comprises a plurality of metasurface units; and
    wherein the first surface is opposite to the second surface.

8. The method for manufacturing the compound lens according to claim 7, wherein in a case that the lens is a biconvex spherical lens, the acquiring a lens combination comprising a substrate and a lens comprises:
    acquiring the substrate;
    spin-coating a first photoresist on an upper surface of the substrate;
    processing the first photoresist through any one of grayscale photolithography, nanoimprint lithography, laser direct write lithography and thermal reflow to form a pattern matching a first spherical surface of the biconvex spherical lens;
    etching the upper surface to form the first spherical surface of the biconvex spherical lens;
    spin-coating a second photoresist on a lower surface of the substrate;
    processing the second photoresist through any one of grayscale photolithography, nanoimprint lithography, laser direct write lithography and thermal reflow to form a pattern matching a second spherical surface of the biconvex spherical lens; and
    etching the lower surface to form the second spherical surface of the biconvex spherical lens, and obtaining the biconvex spherical lens, and wherein after forming a first metasurface array on the second surface of the substrate based on the surface shape, the method further comprises:
   forming a second metasurface array on the first surface of the substrate, wherein the second metasurface array comprises a plurality of metasurface units; and
   bonding the biconvex spherical lens to the first surface of the substrate, wherein the second metasurface array is arranged in a cavity formed by the biconvex spherical lens and the first surface.

9. The method for manufacturing the compound lens according to claim 7, wherein in a case that the lens is a plano-convex spherical lens, the acquiring a lens combination comprising a substrate and a lens comprises:
   acquiring the substrate;
   spin-coating a third photoresist on a first surface of the substrate;
   processing the third photoresist through any one of gray-scale photolithography, nanoimprint lithography, laser direct write lithography and thermal reflow to form a pattern matching a spherical surface of the plano-convex spherical lens; and
   etching the first surface to form the plano-convex spherical lens, and obtaining the lens combination comprising the substrate and the lens.

10. The method for manufacturing the compound lens according to claim 7, wherein the acquiring the surface shape of the lens comprises:
   acquiring surface shape data of the lens by a profilometer; and
   fitting the surface shape data to obtain the surface shape.

11. The method for manufacturing the compound lens according to claim 7, wherein the forming a first metasurface array on a second surface of the substrate based on the surface shape comprises:
   modeling a plurality of candidate metasurface units with a finite difference time domain method;
   and obtaining, for each of the plurality of candidate metasurface units, phases provided by the candidate metasurface unit at different incident wavelengths;
   determining, for each of the plurality of candidate metasurface units, a dispersion provided by the candidate metasurface unit based on the phases provided by the candidate metasurface unit;
   determining, based on the surface shape, a theoretical phase and a theoretical dispersion required by the lens at a preset position with a distance from a center of the lens; and
   selecting the metasurface units to be arranged on preset positions from the plurality of candidate metasurface units, based on the theoretical phases, the theoretical dispersions, the phases and the dispersions, to form the first metasurface array.

12. The method for manufacturing the compound lens according to claim 8, wherein the acquiring the substrate comprises:
   acquiring a to-be-processed substrate;
   covering, by a mask, a first preset area on an upper surface of the to-be-processed substrate, and etching the upper surface of the to-be-processed substrate, to make an area of the substrate not covered by the mask have a first height; and
   covering, by a mask, a second preset area on the upper surface of the to-be-processed substrate; etching the upper surface of the to-be-processed substrate, to make an area of the substrate not covered by the mask have a second height; and obtain the substrate with a symmetrical stepped surface, wherein the second preset area covers the first preset area and is larger than the first preset area.

13. The method for manufacturing the compound lens according claim 7, wherein each of the metasurface unit and the substrate is made of a Silicon-on-Insulator chip.

14. An infrared detector, comprising a compound lens, a substrate wafer, a focal plane detector array, a readout circuit, a bonding section, and an electrode welding spot, wherein the compound lens comprises:
   a substrate;
   a lens arranged on a first surface of the substrate; and
   a first metasurface array arranged on a second surface of the substrate based on a surface shape of the lens, wherein the first metasurface array comprises a plurality of metasurface units, and
   wherein the first surface is opposite to the second surface.

15. The infrared detector according to claim 14, wherein the compound lens further comprises:
   a bonding layer configured to connect the lens to the first surface of the substrate.

16. The infrared detector according to claim 15, wherein in a case that the lens is a biconvex spherical lens, the compound lens further comprises:
   a second metasurface array arranged on the first surface of the substrate, wherein the second metasurface array is arranged in a cavity formed by the biconvex spherical lens and the first surface; and
   wherein the second metasurface array comprises a plurality of metasurface units.

17. The infrared detector according to claim 14, wherein the lens and the substrate are an integrated structure.

18. The infrared detector according to claim 14, wherein the second surface of the substrate is a stepped surface, and the stepped surface is of bilateral symmetry.

19. The infrared detector according to claim 14, wherein the metasurface unit is an axisymmetric metasurface unit.

* * * * *